United States Patent [19]
Mancuso et al.

[11] Patent Number: 5,757,977
[45] Date of Patent: May 26, 1998

[54] FUZZY LOGIC FILTER FOR REDUCING NOISE AND SHARPENING EDGES OF DIGITAL IMAGE SIGNALS

[75] Inventors: Massimo Mancuso, Favara; Rinaldo Poluzzi, Milan; Gianguido Rizzotto, Como, all of Italy

[73] Assignee: SGS-Thomson Microelectronics S.r.l., Agrate Brianza, Italy

[21] Appl. No.: 396,212

[22] Filed: Feb. 28, 1995

[30] Foreign Application Priority Data

Feb. 28, 1994 [EP] European Pat. Off. ............ 94830092

[51] Int. Cl.$^6$ .................. G06K 9/40; G06T 5/00
[52] U.S. Cl. .............. 382/260; 382/254; 358/447; 364/606
[58] Field of Search .................... 382/176, 260, 382/261, 262, 263, 264, 265, 266, 254; 358/463, 447, 455; 364/625, 627, 700, 701, 606

[56] References Cited

U.S. PATENT DOCUMENTS

| | | | |
|---|---|---|---|
| 4,402,006 | 8/1983 | Karlock | 348/627 |
| 4,953,027 | 8/1990 | Tong | 348/625 |
| 4,972,256 | 11/1990 | Hirosawa | 348/625 |
| 5,023,919 | 6/1991 | Wataya | 348/625 |
| 5,032,909 | 7/1991 | Sato | 348/627 |
| 5,047,856 | 9/1991 | Miller | 348/625 |
| 5,231,677 | 7/1993 | Mita | 348/625 |
| 5,245,445 | 9/1993 | Fujisawa | 382/261 |
| 5,339,365 | 8/1994 | Kawai | 382/264 |
| 5,371,695 | 12/1994 | Baraszu | 364/724.19 |
| 5,414,473 | 5/1995 | Hong | 348/627 |
| 5,519,451 | 5/1996 | Clatanoff | 348/625 |
| 5,576,548 | 11/1996 | Clarke | 382/261 |
| 5,581,305 | 12/1996 | Min | 348/571 |
| 5,621,474 | 4/1997 | Mancuso | 348/606 |

FOREIGN PATENT DOCUMENTS

| | | | |
|---|---|---|---|
| 0 415 648 | 3/1991 | European Pat. Off. | G06F 15/66 |
| 05 054 190 | 3/1993 | Japan | G06K 9/38 |
| 05 094 523 | 4/1993 | Japan | G06F 15/66 |

OTHER PUBLICATIONS

Zhao et al., "An Effective Fuzzy Logic Approach to Image Enhancement," *Proceedings of the SPIE, Visual Communications and Image Processing* '93 2094(1): 244–251, Cambridge, Mass., Nov. 8–11, 1993.

Tao et al., "A Fuzzy If–Then Approach to Edge Detection," *IEEE*, 1356–1359, Jul. 1993.

Russo and Ramponi, "Fuzzy Operator for Sharpening of Noisy Images," *Electronics Letters* 28(18):1715–1717, 1992.

(List continued on next page.)

*Primary Examiner*—Dwayne Bost
*Assistant Examiner*—Brian L. Johnson
*Attorney, Agent, or Firm*—David V. Carlson; Seed and Berry LLP

[57] ABSTRACT

A filter achieving noise reduction and digital signal image edge enhancement includes two noise reduction circuits designed to enhance an image edge. The noise reduction circuits comprise both comparison units, which receive separate digital signals of an image and an inferential circuit connected to said comparison elements. Each inferential circuit uses a fuzzy logic unit designed to define activation levels based on signals generated by the comparison elements. The filter also includes a noise detection circuit and an image edge detection circuit both connected to the noise reduction circuit and designed to perform operations in accordance with fuzzy logic rules on the basis of the activation levels defined in the inferential circuits. The filter also includes a noise reduction circuit connected to the noise detection circuit and is designed to filter the digital image signals on the basis of the operations performed by the noise detection circuit. The filter additionally includes an image edge enhancement circuit connected to the noise reduction circuit and to the image edge detection circuit and is designed to perform on filtered digital image signals image edge enhancement on the basis of the operations performed by the image edge detection circuit.

17 Claims, 8 Drawing Sheets

OTHER PUBLICATIONS

Russo and Ramponi, "Working On Image Data Using Fuzzy Rules," *Signal Processing VI: Theories and Applications*, 1413–1416, Elsevier Science Publishers B.V., 1992.

Kaoru Arakawa, et al., "A Non–linear Digital Filter Using Fuzzy Chiskry," IEEE 0–7803–0532–Sep. 1992.

Shaomin Peng, et al., "Fuzzy Filtering for Mixed Noise Removal During Image Processing," IEEE 0–7803–1896–X/94, 1994.

Ching–Yu Tyan, et al., "Image Processing—Enhancement, Filtering and Edge Detection Using the Fuzzy Logic Approach," IEEE 0–7803–0614–Jul. 1993.

FUZZY LOGIC FILTER FOR REDUCING NOISE AND SHARPENING EDGES OF DIGITAL IMAGE SIGNALS

TECHNICAL FIELD

The present invention relates to a filter for video signals and in particular to a filter operating with fuzzy logic to perform noise reduction and edge enhancement present in digital image signals.

BACKGROUND OF THE INVENTION

It is known that, in general, reduction of the noise contained in signals of any type is done using low pass filters with a pre-set frequency range. In the majority of cases, however, the use of such filters involves reduction of signal components which may contain useful information. In the case of image signals, for example, the use of low pass filters involves attenuation of the high frequency components of said signals which contain useful information on the image contours or edges. To reduce this shortcoming adaptive filters are used which adapt their frequency response to the characteristics of the signals present at their input. Adaptive filters, however, are very complex at the circuit level.

In the image signal processing field reduction of noise takes place by means also of non-linear filters among which there are filters known in the literature as mean filters, and also filters operating with fuzzy logic. The "fuzzy" procedures used in filtering techniques employed to reduce the noise contained in image signals are described, for example, in the article "Fuzzy Operators for Sharpening of Noisy Images" by F. Russo and G. Ramponi appearing in Electronics Letters Vol. 28 No. 18 August 1992 incorporated herein by reference. These procedures are also described in the article "Working on Image Data Using Fuzzy Rules" by F. Russo and G. Ramponi appearing in Signal Processing IV Theories and Applications, Proceedings of EUSIPCO-92, Brussels, Belgium, August 1992 and in the article "A Fuzzy If-Then Approach to Edge Detection" by C. W. Tao and W. E. Thompson, Proceedings of the Second IEEE Conference on Fuzzy Systems, San Francisco, Calif., March/April 1993 both of which are also incorporated herein by reference. These filters, however, exhibit a complex structural architecture and are consequently costly to produce.

In the framework of image signal processing a basic operation to be performed is image edge enhancement. This operation is performed because, in general, the video signal band is limited for transmission reasons (e.g. TV signals) and for the use of so-called compression algorithms (e.g. those adopted in JPEG and MPEG standards). Video signal band limitation involves attenuation of the high frequency components of the signals and consequently a loss of image edge definition. Sharpening of these image edges requires therefore high pass filtering to compensate for attenuation towards the high frequencies.

From the foregoing it can be seen that noise reduction and image edge sharpening are two processes difficult to reconcile because the noise reduction requires a further reduction of the video signal band and removal of high frequency components while edge sharpening requires increasing the high frequency components of these signals. The solution generally adopted in the prior art is that of performing the two processes in cascade, i.e. perform first the filtering of the low frequency video signal components to be processed to reduce noise and then perform filtering of the high pass components to sharpen the image edges. This solution, however, is not optimal because the first filtering attenuates further the edges while the second filtering again amplifies the noise.

SUMMARY OF THE INVENTION

The technical solution according to principles of the present invention is to provide a filter operating on digital image signals capable of discriminating between information on the edges and information on noise. In this manner the filter provides noise reduction for digital image signals in which there is noise and a sharpening of edges when there are digital image signals for said edges.

The inventive filter circuit described herein is based on fuzzy logic. The filter architecture is structurally simple and consequently economical to produce. Accordingly, the technical problem of discriminating between image edge information and noise information is solved by a filter operating with fuzzy logic for noise reduction and edge enhancement present in digital image signals as claimed herein. The characteristics and advantages of the filter operating with fuzzy logic for noise reduction and edge enhancement present in digital image signals in accordance with the present invention are set forth in the description of an embodiment thereof given below by way of nonlimiting example with reference to the annexed drawings.

DETAILED DESCRIPTION OF THE INVENTION

Figure 1A:
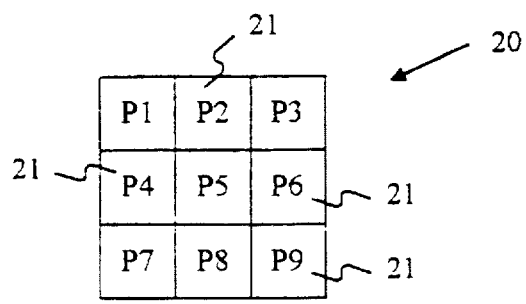
FIG. 1a is an example of a 3×3 pixel window in a video image.

FIG. 1a represents a window 20 of pixels 21 of a video image. Each pixel 21 has a luminance value defined by an 8 bit number, and thus ranges from 0 to 255 in value. In the FIG. 1a shown, pixel P5 is defined as the target pixel because it is the pixel of interest. The other pixels in the window will be used according to the invention to provide information about the target pixel and, possibly, result in changing the value of the target pixel in the output signal based on the fuzzy logic circuits described herein. The window may be any size, such as 3×3, 6×6, 4×4, etc.

Figure 1B:
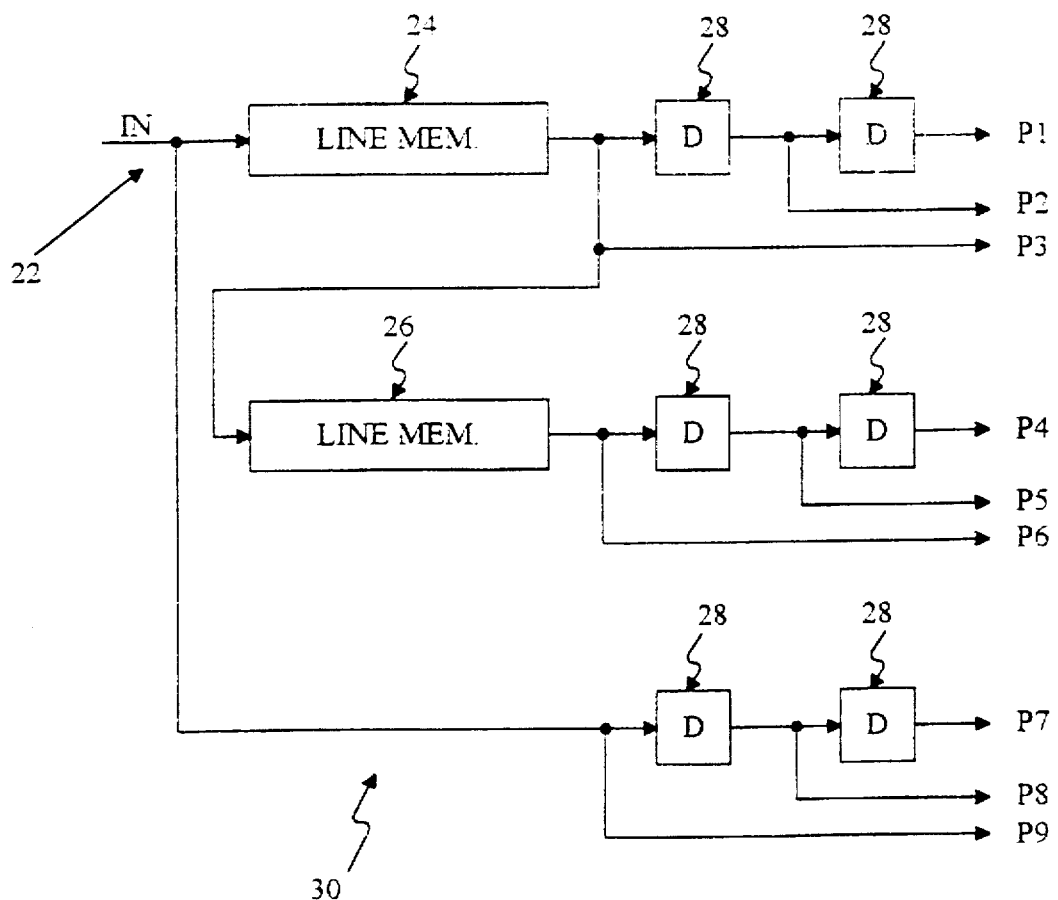
FIG. 1b is a schematic diagram of an interface of a filter according to principles of the present invention.

FIG. 1b is a schematic diagram of an interface circuit for a filter according to the present invention for providing inputs to the filter. According to principles of the present invention, the filter operates on one window 20 of an image data at a time. When operating on rasterized image data, for example, the window 20 may comprise 3 by 3 pixels P1–P9 when examining the target pixel P5. Each pixel may be a luminance or gray level value that is quantized on 8 bits. The rasterized data delayed by time is fed through the input 22 of the interface 30 and are stored in line memory 24 and 26 connected in series. The two line memory 24 and 26 along with data latches 28 comprise the interface and provide the inputs to the filter of FIG. 2.

Figure 1C:
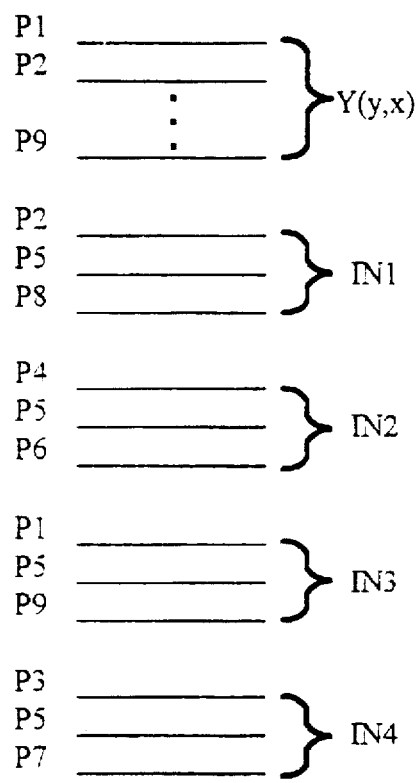
FIG. 1c shows the digital signals grouped into a plurality of sets.
Figure 6:
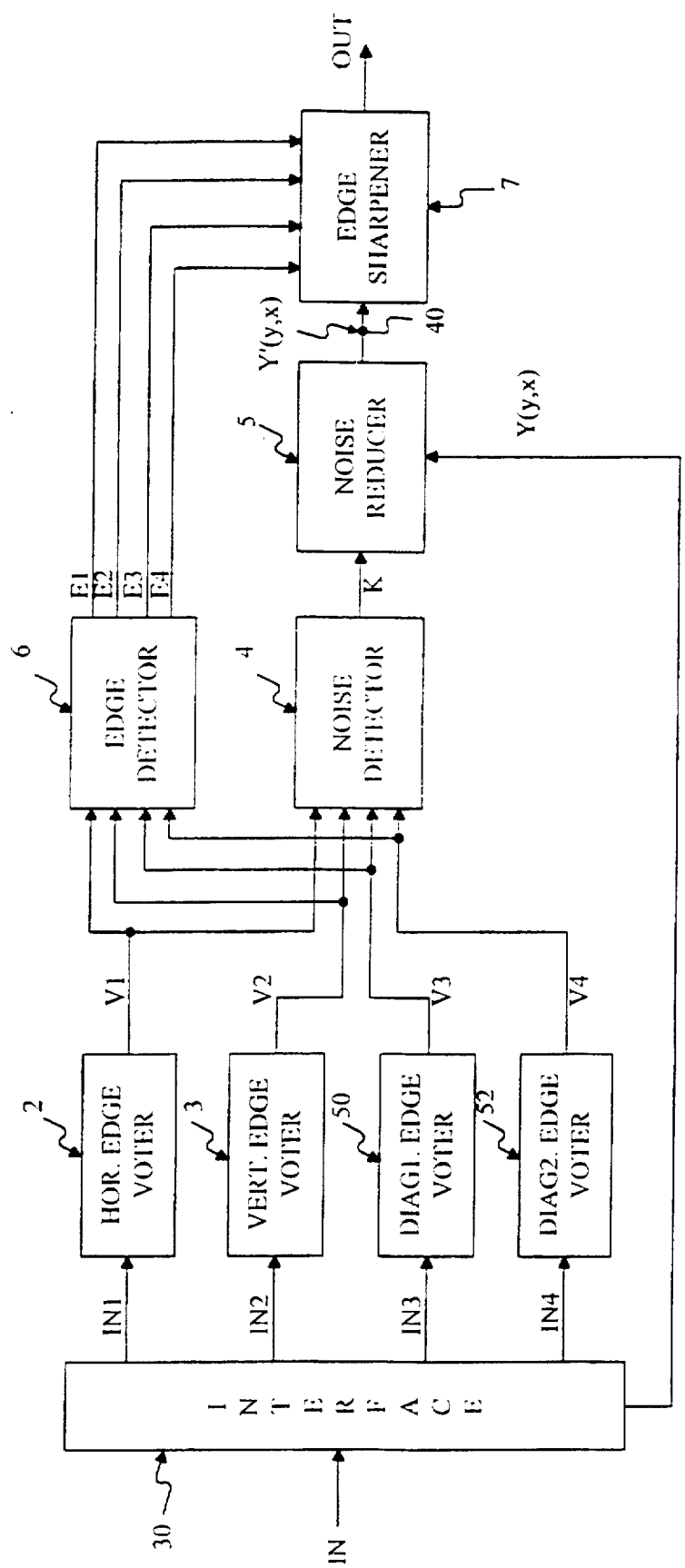
FIG. 6 is a circuit schematic of an alternative image filter circuit.
Figure 7:
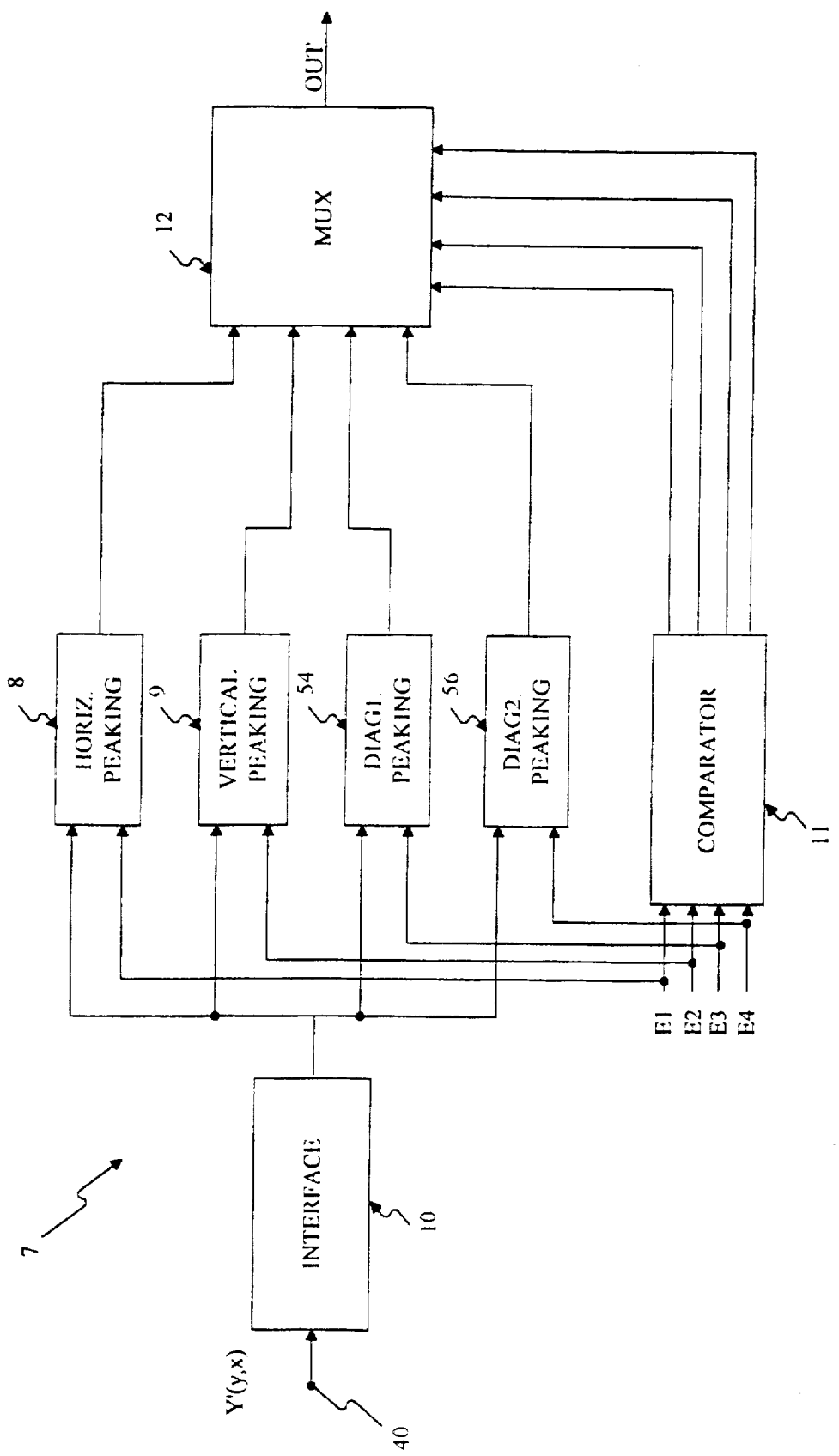
FIG. 7 is a circuit schematic of the edge sharpener circuit of FIG. 6.

As shown in FIG. 1c, the signal IN1 is a set of three vertical pixels P2, P5 and P8, grouped together for detecting vertical gray level transition. The signal IN2 is a set of three horizontal pixels P4, P5 and P6 grouped together for detecting horizontal gray level transition. Similarly, set IN3 comprises P1, P5, and P9 for detecting diagonal transition along the P1-P5-P9 direction and set IN4 comprises P3, P5, and P7 for detecting diagonal transition along the P3-P5-P7 direction. In the embodiment shown, pixels P1 through P9 comprise a set of inputs Y(y,x) having four transitional directions, vertical, horizontal, left diagonal, and right diagonal. FIGS. 2–5 illustrate a circuit for filtering based on two sets, one in the vertical direction and one in the horizontal direction. FIGS. 6 and 7 illustrate filtering based on four sets. Persons of skill in the art will appreciate that principles disclosed herein may be easily extended to more than two or four sets.

Figure 2:
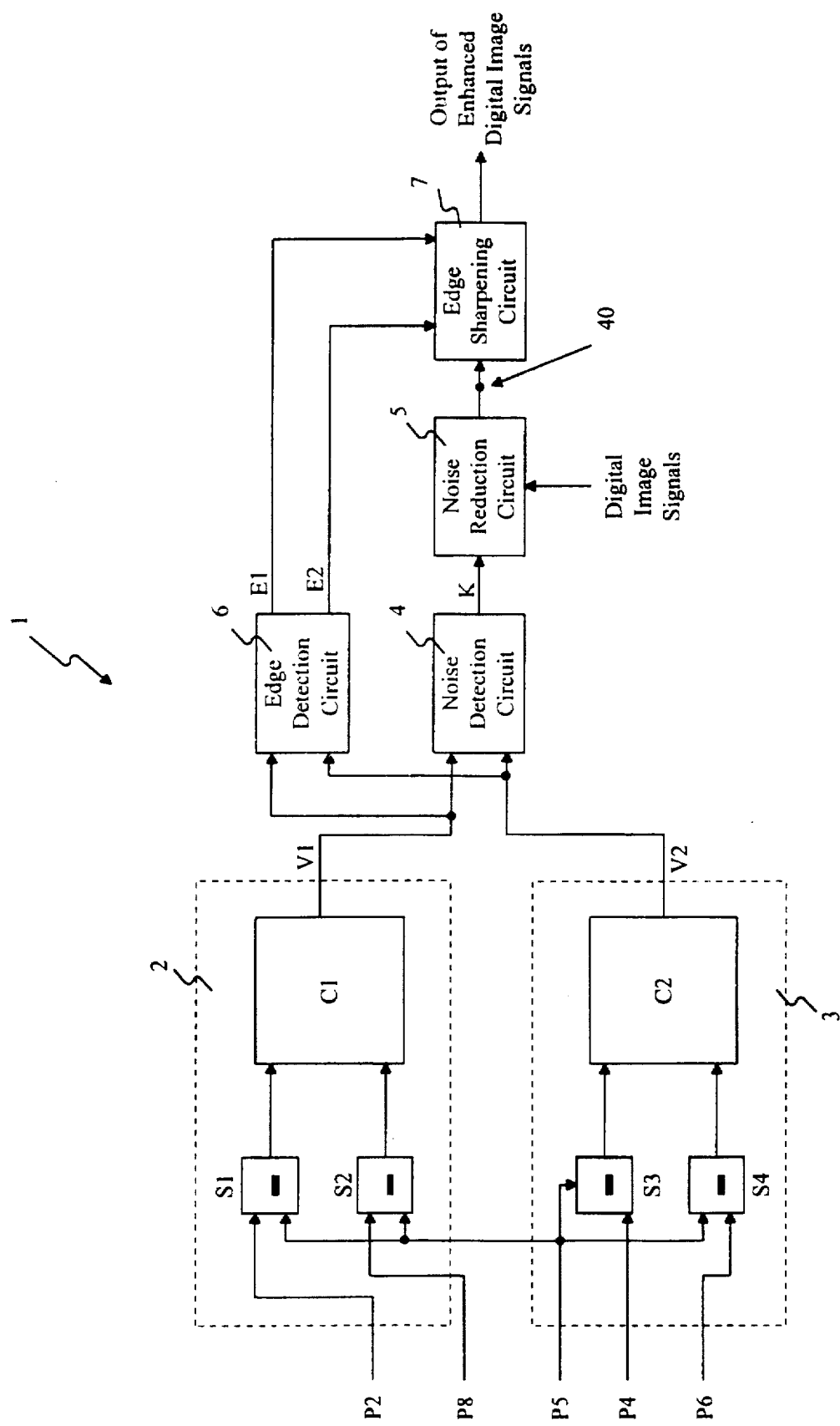
FIG. 2 shows a schematic view of a filter provided in accordance with the present invention.

The diagram of FIG. 2 represents filter 1 operating in accordance with fuzzy logic on digital image signals comprising at least a first and a second processing circuit means 2 and 3 designed to detect and enhance an image edge. Each of said processing circuit means comprises at least one first and one second comparison element S1, S2, S3 and S4 and one inferential circuit, C1 and C2, respectively. The processing circuits 2 and 3 each have at least a first and a second input terminal and at least one output terminal and said input terminals being designed to received separate digital signals of the image. The inferential circuits C1 and C2 each having at least a first and a second input terminal and at least one output terminal. For example, P2 and P5 of FIG. 1 may be connected to S1's inputs, P8 and P5 to S2's inputs, P5 and P4 to S3's inputs, and P5 and P6 to S4's inputs. Thus, P2, P5 and P8 comprise one set of digital image signals provided to the first processing circuit means 2 and P4, P5 and P6 comprise another set of digital image signals provided to the second processing circuit means 3. The comparator S1 outputs a difference between its two inputs, in this case P2 and P5. Similarly, the comparator circuits S2, S3 and S4 each output a signal based on the difference in value between the two inputs.

Figure 3A:
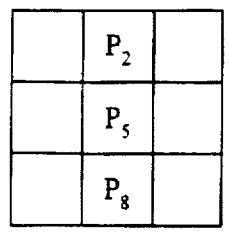
FIG. 3a shows a plurality of digital image signals used as inputs to one of the processing circuit means of the filter of FIG. 2.

Referring to FIG. 3a, it shows a plurality of digital image signals P2, P5 and P8 representing one set of signals used as inputs to the first processing circuit means 2.

Figure 3B:
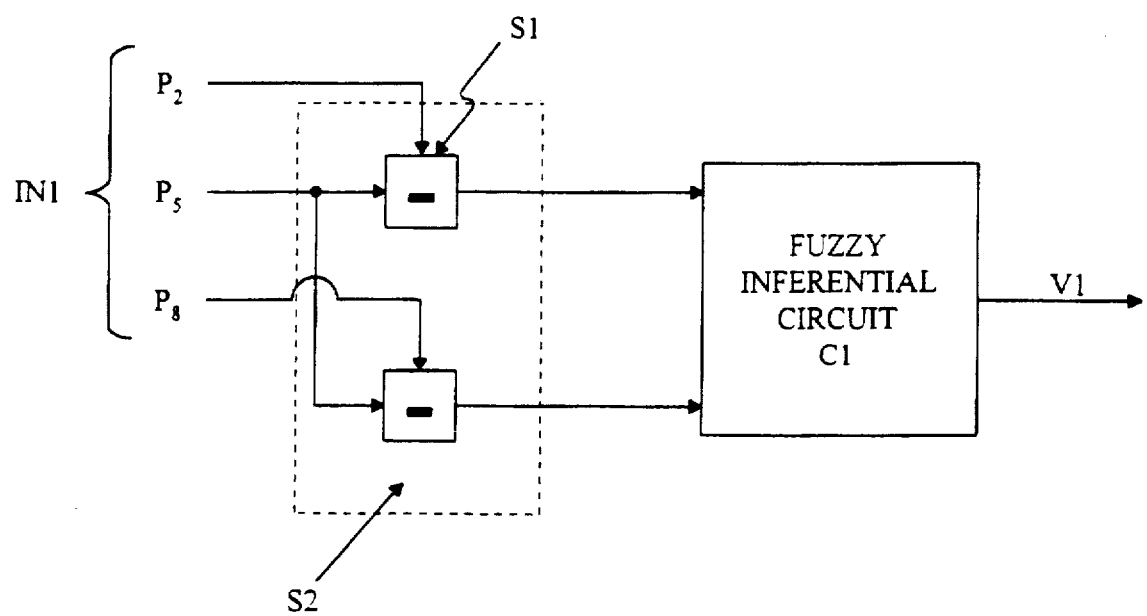
FIG. 3b shows a detailed circuit diagram of comparison elements of the filter of FIG. 2.

Referring to FIG. 3b, it shows a detailed diagram of inputs IN1 to the comparison elements S1 and S2 for detecting gray level transition along a vertical direction. P2 and P5 are connected to the comparison element S1, and P8 and P5 are connected to the comparison element S2. In the embodiment shown, the comparison elements S1 and S2 are subtractors. Thus, S1 outputs P2 minus P5, and S2 outputs P8 minus P5. These two outputs are connected to the inferential circuit C1.

Referring back to FIG. 2, the first and second input terminals of the inferential circuit C1 included in the first processing circuit means 2 are connected respectively to the output terminals of the first and second comparison elements S1 and S2 included in said processing circuit means 2. The first and second input terminals of the inferential circuit C2 included in the second processing circuit means 3 are connected respectively to the output terminals of the first and second comparison elements S3 and S4 included in said second processing circuit means 3. The inferential circuits C1 and C2 each include a unit operating in accordance with fuzzy logic designed to define activation levels V1 and V2 based upon signals generated by the comparison elements S1–S4.

In greater detail, each fuzzy logic unit acts along a certain direction of an image to be processed and each activation level V1 and V2 represents a level of reliability that a digital input signal belongs to an image edge located along the direction perpendicular to that on which the unit operates. For example, the first processing circuit means 2 may take as input IN1 comprising vertical pixels P2, P5 and P8 of FIG. 1; and the inferential circuit C1 may detect gray level transition along a vertical direction and provide output V1 which represents a level of reliability that the target pixel P5 may belong to a horizontal image edge. Similarly, the second processing means 3 may take as input IN2 comprising horizontal pixels P4, P5 and P6 of FIG. 1; and the inferential circuit C2 may detect gray level transition along a horizontal direction and provide output V2 which represents a level of reliability that the target pixel P5 may belong to a vertical image edge. Each activation level V1 or V2 may take on any value in the interval from 0 to 1. The number of processing circuit means included in the filter 1 depends on the size of an image to be processed and on the number of directions along which the fuzzy logic units operate. For example, two additional processing circuit means are necessary if diagonal directions or other sets of pixels are to be processed as well as the horizontal and vertical sets. A brief discussion of fuzzy logic rules and fuzzy logic circuits may be helpful. The use of fuzzy logic and a fuzzy circuit is well known. A large number of prior art articles discuss fuzzy logic rules that need not be repeated here. Such fuzzy logic rules have been applied in various attempts for sharpening images in the past. These are described in the articles already incorporated by reference. The circuits for the fuzzy processors C1 and C2 are implemented by any known technique, such as a look-up table (via any suitable memory storage circuit), a dedicated fuzzy logic engine of the type available in custom software routines, a general purpose fuzzy logic machine or the like, many being suitable from those available in the prior art. The output of the fuzzy process circuits C1 and C2 is a value V1 and V2, respectively, ranging in value from 0 to 1, as described above. Thus, the outputs V1 and V2 can also be viewed as indicators that the target pixel, P5 in this case, had its value altered by noise. A high V1 (near 1.00) represents a great deal of noise in the value for pixel along the vertical direction; a high V2 represents a great deal of noise being present in the value for the pixel along the horizontal direction. The minimum number of directions according to the invention is two, thus at least two sets of pixels must be considered, each including the target pixel. Thus, the noise detector circuit will receive at least two inputs, one representing the noise of a pixel compared to a first set and the other representing the noise of a pixel compared to the second set. The filter 1 includes also a noise detection circuit 4 having at least one first and one second input terminal and at least one output terminal.

The first and second input terminals of said noise detection circuit 4 are connected respectively to the output terminal of the inferential circuit C1 included in the first processing circuit means 2 and to the output terminal of the inferential circuit C2 included in the second processing circuit means 3. Said noise detection circuit 4' is designed to perform operations in accordance with fuzzy logic rules on the basis of activation levels V1 and V2 output by the inferential circuits C1 and C2. The result of said operations is represented by output signal K which may take on any value in the interval 0 to 1. Said output number K indicates a degree of reliability which the noise detection circuit 4 places in deeming that the target pixel P5 contains noise or not. In one embodiment, the noise detection circuit 4 uses the following rule:

If the fuzziness along the horizontal direction is High and the fuzziness along the vertical direction is High, then the pixel is noisy. Thus, if input V1 is high and input V2 is high, then K is considered high and is output accordingly.

The implementation of the rule may be done through a look-up table, dedicated fuzzy engine, or alternatively by general purpose fuzzy machine.

The filter 1 includes also a noise reduction circuit 5 having at least a first and a second input terminal and at least one output terminal. The first input terminal for said noise reduction circuit 5 is coupled to the noise detection circuit output terminal 4 and the second input terminal of said noise reduction circuit 5 is designed to receive the same digital image signals as the inputs to the comparison elements S1–S4. The noise reduction circuit 5 filters the digital image signals on the basis of the value of the signal K, at separate instants in time in accordance with pre-set time intervals. In one embodiment, one noise reduction formula used by the noise reduction circuit 5 may be the following:

Noise_Red_out=K*(Classical_filter_out)+(1-K)*P5

Figure 4:
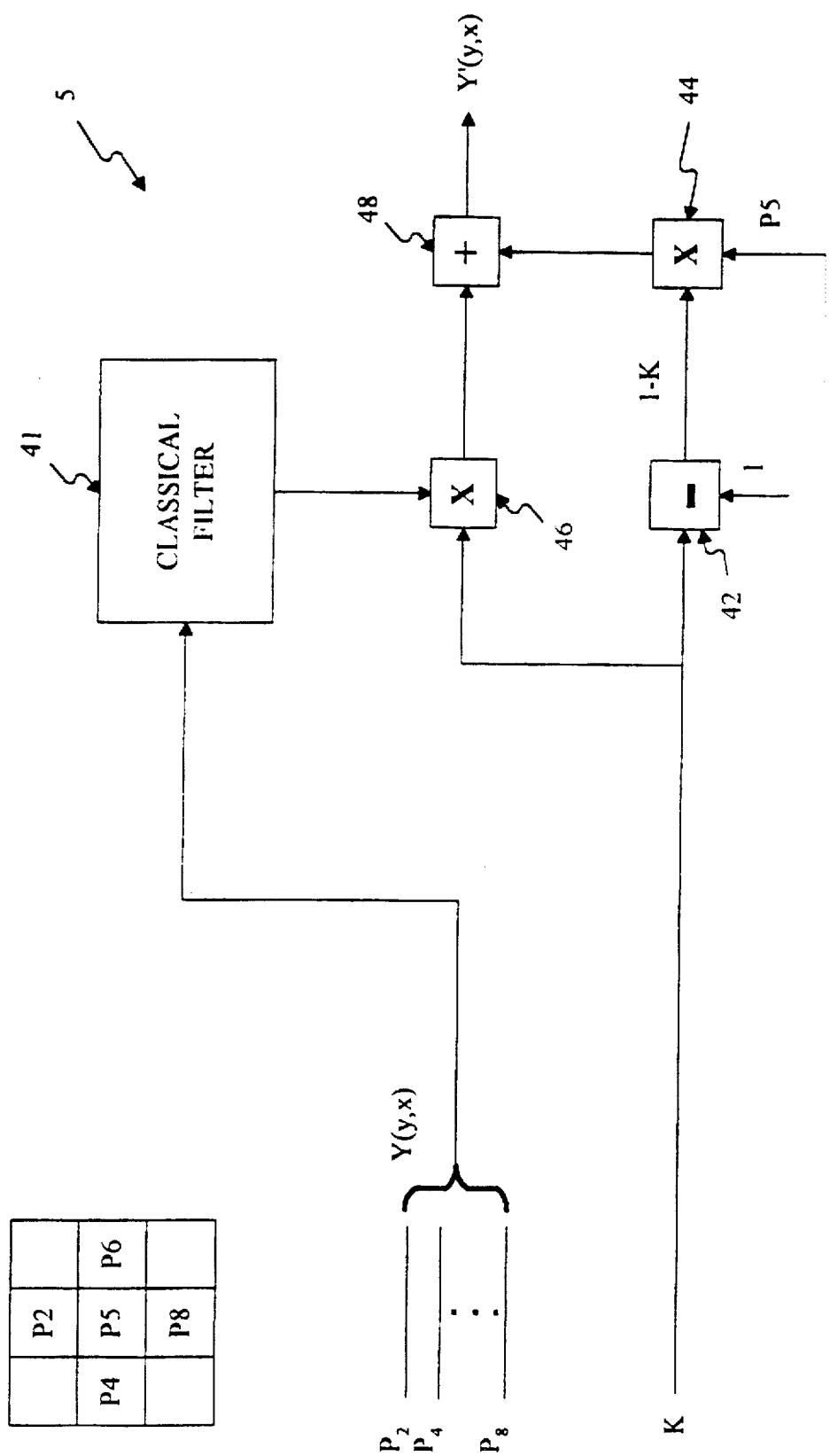
FIG. 4 shows one embodiment of a noise reduction circuit of the filter of FIG. 2.

Referring to FIG. 4, it shows the noise reduction circuit 5 in detail. Y(y,x) comprising pixels P2, P4, P5, P6, P8 are connected to inputs of a classical filter 41. The noise reliability value K is subtracted from one by a subtractor 42 and multiplied by a multiplier 44 by P5 to produce the term (1-K)*P5. At the same time, K is multiplied by the output of the classical filter 41 to produce the term K*(Classical_filter_out). Both terms are then added together by an adder 48 to produce the output Y'(y,x). As can be seen from the formula, for K=1 the digital image signals are filtered while for K=0 they remain unchanged, and in addition all the intermediate conditions between these two values may occur with the result of filtering ranging from unchanged to complete filtering.

Referring back to FIG. 2, the filter 1 includes also an image edge detection circuit 6 having at least one first and one second input terminal and at least one first and one second output terminal. The first and second input terminals of said image edge detection circuit 6 are connected to the output terminal of the inferential circuit C1 included in the first processing circuit means 2 and the first output of the inferential circuit C2 included in the second processing circuit means 3 respectively. The image edge detection circuit 6 includes either at least one memory register for storing at least one fuzzy logic process or one fuzzy logic unit and is designed to perform operations on the basis of activation levels V1 and V2 defined in the inferential circuits C1 and C2.

The result of said operations is represented by signals E1 and E2 which take on values in an appropriate time interval and represent, each, a reliability level that a digital image signal P5 belongs to a particular type of image edge rather than another. In one embodiment, one rule among a system of fuzzy rules used by the image edge detection circuit is stated as follows:

If V1 is High and V2 is Low, then E1 is High; and

If V1 is Low and V2 is High, then E2 is High

E1 represents a possibility that a horizontal edge is present in the window of pixels and E2 represents a possibility that a vertical edge may be present.

The filter 1 also includes an image edge sharpening circuit 7, shown in FIG. 2, having at least one first, one second and one third input terminals and at least one output circuit. The first and second input terminals of said image edge sharpening circuit 7 are connected, respectively, to the first and second output terminals of the image edge detection circuit 6 and the third input terminal of said image edge sharpening circuit 7 is connected to the output terminal 40 of the noise reducing circuit 5.

Figure 5:
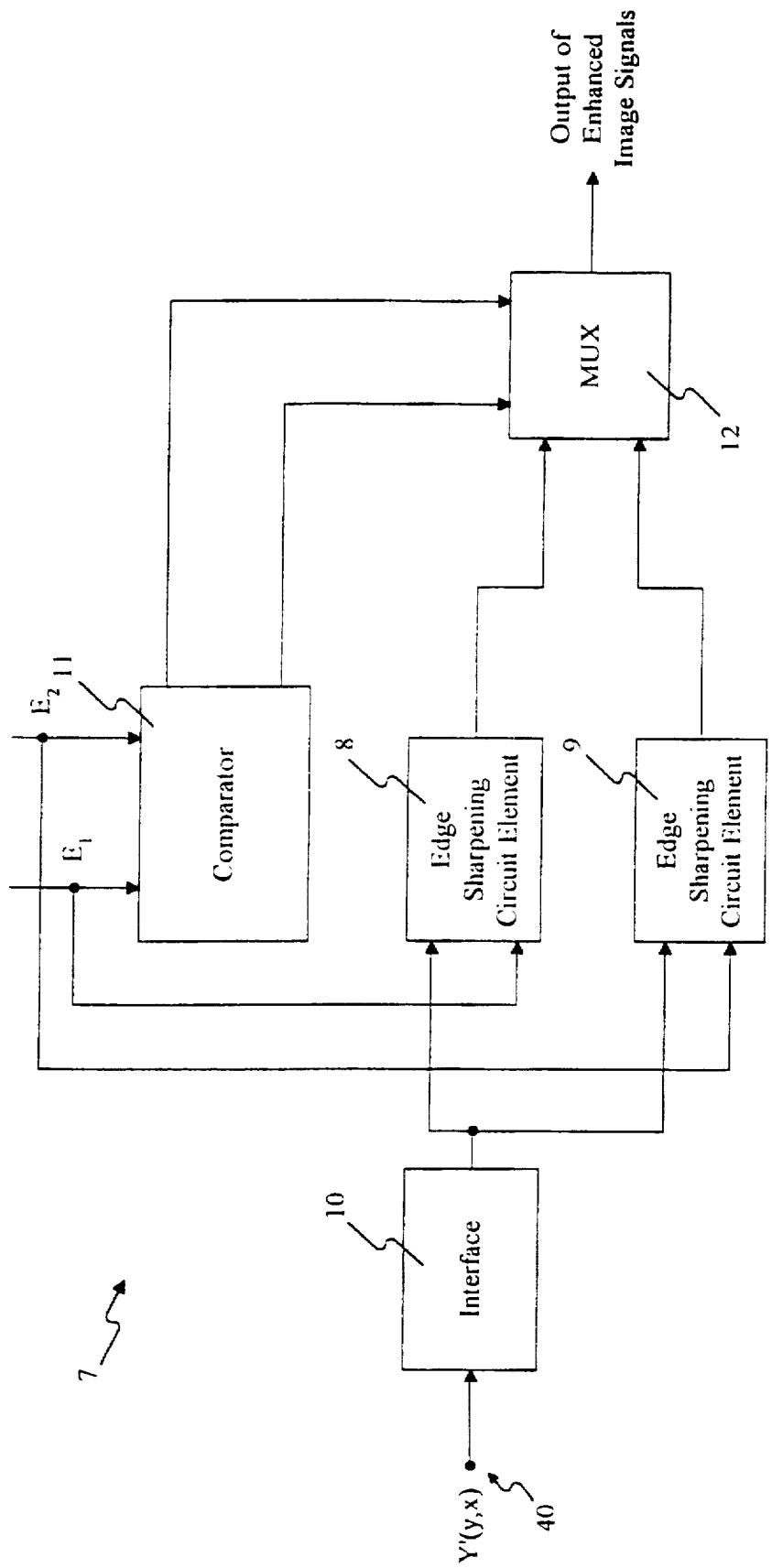
FIG. 5 is a circuit schematic of the image edge sharpening circuit of FIG. 2.

Referring to FIG. 5, it shows a detailed schematic view of the image edge sharpening circuit 7. The image edge sharpening circuit 7 includes at least one first and one second circuit elements 8 and 9 having each at least a first and a second input terminals and at least one output terminal. The first input terminal of the first and second circuit element 8 and 9 are connected to at least one output terminal of an interface circuit 10 which has at least one input terminal coupled to the output terminal 40 of the noise reduction circuit 5 while the second input terminal of the first circuit element 8 and the second input terminal of the second circuit element 9 are connected respectively to the first and second output terminals of the image edge detection circuit 6.

The circuit elements 8 and 9 are designed to perform on filtered digital image signals a sharpening of image edges on the basis of the value of the signals E1 and E2. For example, the circuit elements 8 and 9 may perform sharpening of a horizontal edge and vertical edge respectively of the filtered digital image signals. For image edge sharpening, classical peaking algorithms that are well known in the art may be used. The image edge exaltation circuit 7 includes also a comparator 11 having at least one first and one second input terminal and at least one first and one second output terminal. The first and second input terminals of said comparator 11 are connected respectively to the first and second output terminals of the image edge detection circuit 6.

The image edge exaltation circuit 7 includes also a multiplexer 12 having at least one first, one second, one third and one fourth input terminal and at least one output terminal which is an output terminal of the filter 1. The first and second input terminals of said multiplexer 12 are connected to the output terminal of the first circuit element 8 and to the output terminal of the second circuit element 9 respectively and the third and fourth input terminals of said multiplexer 12 are connected to the first and second output terminals of the comparator respectively 11. Said third and fourth input terminals are command terminals of the multiplexer 12.

The comparator 11 determines among the signals E1 and E2 the one having the maximum value and on the basis of this value places a logic "1" at one of the command terminals of the multiplexer 12. Said multiplexer 12, on the basis of the activated command terminal, selects among output signals of the circuit elements 8 and 9 output signals of the filter 1. While the embodiment shows two command terminals of the multiplexer 12, persons skilled in the art will appreciate that the selecting function may be implemented using only one command terminal to select between the output of the first and second circuit elements 8 and 9.

Referring to FIG. 6, it shows a schematic view of an alternative filter circuit. The interface 30 is similar to the interface 30 of FIG. 1b and produces four sets of signals IN1, IN2, IN3, and IN4 similar to the signals of FIG. 1C. Each of the edge voters 2, 3, 50, 52 is similar to the processing circuit means 2, 3 of FIG. 2. The noise detector 4 is similar to the noise detector of FIG. 2 and produces output K based on the four output signals V1–V4. The output K represents a degree of reliability that the target pixel P5 contains noise. The noise reducer 5 is similar to the noise reduction circuit 5 of FIG. 4 and produces the filtered signal Y'(y,x) at output terminal 40. The image edge detection circuit 6 is similar to the edge detection circuit 6 of FIG. 2. The circuit receives V1 through V4 as input and produces four outputs E1–E4 each representing a reliability level that its respective edge may be present. The edge sharpening circuit 7 is similar to the circuit 7 of FIG. 5.

Referring to FIG. 7, it shows a circuit schematic of the edge sharpening circuit 7 in detail. The filtered image signals Y'(y,x) goes through an interface 10 and is fed to each of four edge sharpening circuit elements 8, 9, 54 and 56. Each of the reliability level outputs E1–E4 is connected to its respective edge sharpening circuit element for controlling the amount of edge sharpening. Each of the reliability level outputs is also connected to a comparator 11 similar to the comparator 11 of FIG. 5. The comparator is designed to select the maximum value among E1 through E4 and place a logic "1" at one of its output terminals. The output terminals of the comparator 11 is connected to command terminals of a multiplexer 12. The multiplexer 12 selects among output signals of the edge sharpening circuit elements 8, 9, 54 and 56.

The invention, as shown and described herein, thus shows the noise detection and noise reduction occurring in parallel with the image edge detection and both providing inputs to the image edge sharpening circuit 7. Thus, both the noise detector 4 and edge detector 6 receive the output signals from the fuzzy logic evaluation circuits (C1 and C2). But, each operates on different logic rules and each produces its own output signals based on its own logic rules. The outputs of these two logic circuits are then input to the image sharpening circuit 7 to produce a new, filtered image that is sharper than was previously achievable. The noise is filtered in a variable sense, the filtering increasing for higher noise levels, while, in a parallel path, edge detection, and hence edge sharpness in the output is enhanced without regard to the rules applied for noise filtering but only with regards to its own rules. As will be appreciated, the noise and edge detection rules may be selected as desired by the end user and some specific embodiments have been given herein by way of examples.

It is also clear that modification, integration and replacement of other elements may be made to the embodiments described above. For example, any or all aspects of the present invention may be implemented through software. Other equivalent devices or steps may be substituted for those described which operate according to principles of the present invention, and thus fall within the scope of the appended claims.

We claim:

1. A fuzzy logic filter for digital image signals, comprising:

a first and second processing circuit each having a first and second comparison element each for accepting a comparison digital signal on a first input, a measuring digital signal on a second input, and providing a differential signal on an output, and each processing circuit having an inferential circuit with a first and second input coupled to the output of each comparison element, respectively, each inferential circuit for defining activation levels and providing them to an output according to fuzzy logic rules based on the differential signal inputs;

a noise detection circuit having a first input coupled to the output of the inferential circuit of the first processing circuit, and a second input coupled to the output of the inferential circuit of the second processing circuit, the noise detection circuit for providing noise level signals to an output, the noise level signals produced according to fuzzy logic rules based on the activation level inputs;

a noise reduction circuit having a first input coupled to the output of the noise detection circuit, and a second input coupled to digital image signals, the noise reduction circuit for providing filtered image signals to an output according to fuzzy logic rules, the amount of filtering based on the input noise level signals;

an edge detection circuit having inputs connected to the respective output of the inferential circuit of both the first and second processing circuit, the edge detection circuit for providing edge probability signals to a pair of outputs according to fuzzy logic based on the activation level inputs;

an edge enhancement circuit having a first and second input coupled to the respective outputs of the edge detection circuit, and having a third input coupled to the output of the noise reduction circuit, the edge enhancement circuit for producing, to an output, enhanced digital image signals according to fuzzy logic rules based on the edge probability signal inputs and the digital image signal input.

2. The filter in accordance with claim 1 wherein the image edge detection circuit comprises at least one memory register designed to memorize at least one fuzzy logic process.

3. The filter in accordance with claim 1 wherein the image edge detection circuit comprises a unit operating in accordance with fuzzy logic.

4. The filter in accordance with claim 1 wherein at least a first and a second circuit element included in the image edge enhancement circuit have each at least a first and a second input terminal and at least an output terminal and the first input terminal of said first and second circuit elements being connected to at least an output terminal of an interface circuit which has at least an input terminal coupled to the output terminal of the noise reduction circuit and the second input terminal of the first circuit element and the second input terminal of the second circuit element being connected to the first and second output terminals respectively of the image edge detection circuit.

5. Filter in accordance with claim 4 characterized in that the image edge enhancement circuit comprises a comparator having at least a first and a second input terminal and at least a first and a second output terminal and the first and second input terminals of said comparator being connected to the first and second output terminals respectively of the image edge detection circuit.

6. Filter in accordance with claim 5 characterized in that the image edge enhancement circuit comprises a multiplexer having at least a first, second, third and fourth input terminals and at least an output terminal which is an output terminal of the image edge enhancement circuit and the first and second input terminals of said multiplexer being connected to the output terminal of the first circuit element and to the output terminal of the second circuit element respectively and the third and fourth input terminals of said multiplexer being connected to the first and second output terminals of the comparator respectively and said third and fourth input terminals being control terminals of said multiplexer.

7. A fuzzy logic filter for digital image signals having a first edge and a second edge, comprising:

a first processing circuit having as input a first set of the digital image signals including a target signal, the first processing circuit for inferring according to fuzzy logic a first activation level that represents how reliably the target signal may belong to the first edge of the digital image signals;

a second processing circuit having as input a second set of the digital image signals including the target signal, the second processing circuit for inferring according to fuzzy logic a second activation level that represents how reliably the target signal may belong to the second edge of the digital image signals;

a noise detection circuit connected to the first and second processing circuits, the noise detection circuit for determining a noise level of the target signal based on the inferred first and second activation levels;

a noise reduction circuit connected to the noise detection circuit, the noise reduction circuit for filtering the target signal based on the determined noise level, the amount of filtering being greater when the determined noise level indicates a greater noise level;

an image edge detection circuit connected to the first and second processing circuits, the image edge detection circuit for producing a first reliability level that represents a likelihood that the target signal belongs to the first edge of the digital image signals rather than the second edge, and producing a second reliability level that represents a likelihood that the target signal belongs to the second edge of the digital image signals rather than the first edge; and an image edge sharpening circuit connected to the image edge detection circuit and the noise reduction circuit, the image edge sharpening circuit for selecting the first edge when the first and second reliability levels indicate that the target signal more likely belongs to the first edge than the second edge and selecting the second edge when the first and second reliability levels indicate that the target signal more likely belongs to the second edge than the first edge, and sharpening the selected edge on the filtered target signal.

8. The filter according to claim 7 wherein the image edge detection circuit includes at least one memory register for storing at least one fuzzy logic process.

9. The filter according to claim 7 wherein the image edge detection circuit operates according to fuzzy logic.

10. The filter according to claim 7 wherein the image edge sharpening circuit includes:

a first circuit element having as inputs the filtered target signal and the first reliability level, the first circuit element for sharpening the first edge of the filtered target signal based on the first reliability level; and a second circuit element having as inputs the filtered target signal and the second reliability level, the second circuit element for sharpening the second edge of the filtered target signal based on the second reliability level.

11. The filter according to claim 10 wherein the image edge sharpening circuit further includes a comparator having as inputs the first and second reliability levels, the comparator for selecting between the first edge and the second edge.

12. The filter according to claim 11 wherein the image edge sharpening circuit further includes a multiplexer connected to the comparator and the first and second circuit elements, the multiplexer for selecting between the signal sharpened by the first circuit element and the signal sharpened by the second circuit element and outputting the selected signal according to the selection of the comparator.

13. The filter according to claim 7 wherein each value of the activation levels, the first and second reliability levels, and the determined noise level ranges from zero to one.

14. The filter according to claim 7 wherein each digital image signal among the first and second sets of the digital image signals represents a gray or luminance level of a pixel.

15. A method of filtering digital image signals according to fuzzy logic, the method comprising:

providing a first set of the digital image signals, the first set including a target signal, the digital image signals having a first edge and a second edge;

providing a second set of the digital image signals, the second set also including the target signal;

for each set of the digital image signals, inferring according to fuzzy logic an activation level that represents how reliably the target signal may belong to one edge of the digital image signals;

determining a noise level of the target signal based on the inferred activation levels;

filtering the target signal based on the determined noise level, the amount of filtering being greater when the determined noise level indicates a greater noise level;

based on the inferred activation levels, producing a first reliability level that represents a likelihood that the target signal belongs to the first edge of the digital image signals rather than the second edge; and producing a second reliability level that represents a likelihood that the target signal belongs to the second edge of the digital image signals rather than the first edge;

selecting the first edge when the first and second reliability levels indicate that the target signal more likely belongs to the first edge than the second edge;

selecting the second edge when the first and second reliability levels indicate that the target signal more likely belongs to the second edge than the first edge; and sharpening the selected edge on the filtered target signal.

16. The method according to claim 15 wherein each value of the activation levels, the first and second reliability levels and the determined noise level ranges from zero to one.

17. The method according to claim 15 wherein each digital image signal among the first and second sets of the digital image signals represents a gray or luminance level of a pixel.

* * * * *